United States Patent [19]
Watanabe

[11] Patent Number: 6,104,047
[45] Date of Patent: Aug. 15, 2000

[54] AVALANCHE PHOTODIODE WITH THIN BUILT-IN DEPLETION REGION

[75] Inventor: Isao Watanabe, Tokyo, Japan

[73] Assignee: NEC Corporation, Tokyo, Japan

[21] Appl. No.: 09/345,975

[22] Filed: Jul. 1, 1999

[30] Foreign Application Priority Data

Jul. 3, 1998 [JP] Japan ................................. 10-189474

[51] Int. Cl.$^7$ ...................... H01L 31/0328; H01L 31/107
[52] U.S. Cl. ........................................... 257/186; 257/438
[58] Field of Search ................................... 257/184, 186, 257/185, 438, 21, 436

[56] References Cited

U.S. PATENT DOCUMENTS

| | | |
|---|---|---|
| 5,552,629 | 9/1996 | Watanabe ................................. 257/438 |
| 5,654,578 | 8/1997 | Watanabe ................................. 257/438 |

FOREIGN PATENT DOCUMENTS

| | | |
|---|---|---|
| 61-198688 | 9/1986 | Japan . |
| 4-10478 | 1/1992 | Japan . |
| 7-38141 | 2/1995 | Japan . |

*Primary Examiner*—Minh Loan Tran
*Attorney, Agent, or Firm*—Hutchins, Wheeler & Dittmar

[57] ABSTRACT

The present invention relates to an avalanche photodiode having a simple structure, high reliability, and a high speed response on the order of Gbps. This photodiode is formed by depositing laminated layers on a semiconductor substrate in the order of an n-type buffer layer, a semiconductor multiplication layer, a p-type semiconductor field buffer layer, a p-type semiconductor light absorbing layer, a p-type semiconductor cap layer, and a p-type semiconductor contact layer, and said p-type semiconductor light absorbing layer is constructed by two layers consisted of a depleted region of a thickness in the range of 10 nm to 0.3 μm disposed adjacent to the p-type semiconductor field buffer layer and a non-depleted layer region at a thickness of less than 2 μm disposed adjacent to the depleted layer region.

9 Claims, 5 Drawing Sheets

AVALANCHE PHOTODIODE WITH THIN BUILT-IN DEPLETION REGION

BACKGROUND OF THE INVENTION

1. Field of the Invention

This invention relates to the structure of an avalanche photodiode used for optical communication, which has features such as a high response speed on the order of Gbps, ease of production, and also high reliability.

2. Background Art

In subscribers optical communication network system in the next generation, an avalanche photodiode (APD) is required, which has a response speed on a order of Gbps and which can be produced at a low cost.

It is necessary for such an element to provide characteristic features such as a simple structure, a mass production ability and a reduction in cost, capability of hybrid mounting on a planar lightwave circuit (PLC) or the like by passive alignment, and also high reliability.

An APD, provided with a buried waveguide structure shown in FIG. 5 is disclosed in Japanese Patent Application, First Publication No. Hei 4-286168 as one of the conventional examples to attain such an objective. Referring to FIG. 5, the reference numeral 51 denotes an $n^+$-InP substrate, 52 denotes an $n^-$-InP optical waveguide layer, 53 a ridge-type optical waveguide area, 54 a matching layer, 55 a InGaAs light absorbing layer, 56 an $n^+$-InP multiplication layer, 57 a p+ diffusion layer, 58 aguard-ring, 59 an InP buried layer, 510 a P-side electrode, and 511 denotes an N-side electrode. This conventional element is constructed by re-growing the active portion after being buried in InP 59 and also by integrating a passive semiconductor light waveguide 53.

Another example is an APD with a mesa-type surface light-incidence structure as shown in FIG. 6 (Shingakukai, Sougou Taikai, 1998, C-3-11). Referring to FIG. 6, the reference numeral 61 denotes an n-type InP substrate, 62 denotes an n-type InAlAs buffer layer, 63 a super lattice multiplication layer, 64 a p-type InP electric field buffer layer, 65 a $p^-$-type InGaAs light absorption layer, 66 a p-type InP cap layer, 67 a $p^+$-type InGaAs contact layer, 68 a light receiving area, 69 a passivation layer, 610 a P-side electrode, 611 an N-side electrode, and 612 denotes an AR coat.

Furthermore, the other example is a mesa-type waveguide structure APD shown in FIG. 7 which is disclosed in Japanese Patent Application, First Publication No. Hei 6-237009. Referring to FIG. 7, the reference numeral 71 denotes an n-type InP substrate, 72 denotes an n-type InAlAs buffer layer, 73 a superlattice multiplication layer, 74 a p-type InAlGaAs field buffer layer, 75 a $p^-$-type InGaAs light absorption layer, 76 a p-type InGaAs buffer layer, 77 a p-type InALAs cap layer, 78 a p-type InGaAs contact layer, 79 a polyimide passivation film, 710 a p-electrode, and 711 an n-electrode.

In the mesa-type APDs shown in FIGS. 6 and 7, the simple structure is adopted by directly coating a polyimide film as a surface protective film 69 and 79 on the active portion of the element formed by mesa-etching.

Still another example is a back-illumination structure planar-type APD shown in FIG. 8 reported in IEEE, Photonics Technology Letters, vol. 8, pp. 827–829, 1996. Referring to FIG. 8, the reference numeral 81 denotes an SIInP substrate, 82 denotes a $p^+$-type buffer layer, 83 a $p^-$-type InGaAS light absorption layer, 84 a p-type InP electric field buffer layer, 85 a non-dope InAlAs/InAlGaAs superlattice multiplication layer, 86 an $n^+$-type InAlAs cap layer, 87 an $n^+$-type InGaAs contact layer, 88 an annular-type isolation trench, 89 a region converted into p-type region, 810 a guard ring, 813 a p-electrode, 811 an n-electrode, 814 a passivation film, and 815 an AR coat. In this case, since this element has a depleted light absorbing layer 83 which is in an order of thicker than 1 μm, it is necessary for from the element structure to provide a guard ring 810.

In contrast, a conventional example shown in FIG. 9 is a pn photodiode which does not have the avalanche multiplication function and which has been disclosed in Japanese Patent Application, First Publication No. 275224, and in Shingaku Giho LQE 97–120 (1997). Referring to FIG. 9, the reference numeral 91 denotes a p-type light absorbing layer, 92 denotes an n-type electrode layer, 93 a carrier transit layer, 94 a p-type carrier blocking layer, 95 an anode electrode, 96 a cathode electrode, 97 a semiconductor substrate, 98 an n-type cliff layer, 99 an i-type setback layer, 910 a p-type contact layer. This is a mesa-type structured element developed for the purpose of obtaining a super-high speed response (40 to 160 GHz) and a high saturated output (~1V). This conventional example seems to have the same structure as that of the APD of the present invention, but this conventional example differs from the present invention in various points. The differences will be described below.

The conventional example shown in FIG. 5 has drawbacks in that the manufacturing process is complicated and the yield is generally low. The conventional APDs shown in FIGS. 6 and 7 have problems in that, since the mesa edge surface (particularly, since the mesa edge surface of the InGaAs light absorption layer) and the surface protective layer are not sufficiently stable, it is difficult to obtain high reliability. The conventional example shown in FIG. 8 has a problem in that its manufacturing process (especially, the manufacturing process of the guard ring) is quite complicated.

There is a problem in that there is no field buffer layer in between the carrier transit layer 93 and the p-type light absorbing layer 91, as seen when the operation of the conventional APD shown in FIG. 9 is considered. Thus, since the only layer to suppress the electric field of the light absorbing layer 91 below the generation limit of a tunnel dark current is the p-type light absorbing layer 91 with a narrow band-gap at the p-side, a problem will arises, when it is operated as an APD, in that the dark current will increase because of the field rise in the light absorbing layer 91 which is in contact with the carrier transit layer 93. Furthermore, a method for providing a high speed response to this conventional APD is disclosed by a reference. That is, as disclosed by the reference, Shingaku Gihou LQE 97–120 (1997), since the p-type light absorbing layer 91 of this conventional example is set not to be depleted at a biased condition, in order to obtain a high speed response, it is necessary for photo-excited carriers (electrons) generated at the light absorbing layer 91 to overcome a hetero-barrier caused by the discontinuity of bands between the p-type light absorbing layer 91 and the carrier transit layer 93. For this purpose, in the light absorbing layer, a very thin region (10 nm) 99 in contact with the carrier transit layer 93 is depleted as a high purity i-type layer, and in the carrier transit layer, a very thin region (10 nm) 98 in contact with the light absorbing layer is doped to a high concentration to form a delta-shaped n-type as the cliff layer. When such a layer structure is formed, and especially when the n-type high-concentration cliff layer is present as an indispensable layer, the dark current inevitably in the element grows in the light absorbing layer before applying the high electric field which is so high as to generate an avalanche multiplication. That is, with this conventional element structure, it is not substantially possible to construct an element which functions as an APD.

The present invention was made to solve the above problems, and it is therefore an object of the present invention to provide an APD having a high speed response on the order of Gbps, and having a simple and reliable structure such that the APD of the present invention can be used to form a novel subscriber optical communication network.

SUMMARY OF THE INVENTION

According to the first aspect of the present invention, the first avalanche photodiode of the present invention is provided with a layered structure comprising: a first conductivity type semiconductor buffer layer, a semiconductor multiplication layer, a second conductivity type field buffer layer, a second conductivity type semiconductor light absorbing layer, a second conductivity type semiconductor cap layer, and a second conductivity type semiconductor contact layer; wherein the second conductivity type semiconductor light absorbing layer is constituted of two layers, one of which is a depleted region with a thickness within a range of 10 nm to 0.3 $\mu$m located adjacent to the second conductivity type field buffer layer, and the other one which is a non-depleted layer with a thickness of less than 2 $\mu$m.

In the above description, the first conductivity type is, for example, n-type, and accordingly the second conductivity type is p-type.

It is preferable for this first avalanche photodiode to provide a edge illumination structure formed by etching.

Furthermore, it is preferable that the carrier concentration of the second conductivity type light absorbing layer alters towards the depleted light absorbing layer stepwise or continuously.

Preferable features of the first avalanche photodiode will be described with reference to FIGS. 1 and 2. The details of those figures are described later in the Detailed Description of the Preferred Embodiments.

Comparing the mesa-type element structure shown in FIG. 1 and the conventional examples shown in FIGS. 5 and 6, the novel feature of the present invention is that the conventional p-type semiconductor light absorbing layer (corresponding to 65 in FIG. 6) is changed into two layers composed of the depleted layer region 15 with a thickness of 10 nm to 0.3 $\mu$m located adjacent to the p-type semiconductor field buffer layer 14 and the non-depleted layer disposed adjacent to the depleted layer region at a thickness of less than 2 $\mu$m.

In the conventional example, the p-type light absorbing layer is constituted by the light absorbing layer 65 which includes a depleted layer with a thickness of 0.4 $\mu$m. In contrast, in the structure of the present invention, since the thickness of the light absorbing layer to be depleted is extremely thin, the surface area of the depleted InGaAs light absorbing layer, having a narrow band-gap, which is exposed at the mesa side wall can be reduced extremely small. Since the aging degradation of the dark current in the conventional mesa-type elements is caused by the instability with elapsed time of the interface between the depleted narrow band-gap InGaAs light absorbing layer, the effect of the aging instability can be minimized by the reduction of the surface area of the light absorbing layer, which results in providing the stable dark current and a stable reliability. It is possible to apply various passivation films 110, not only organic films such as polyimide film, but also inorganic films such as silicon nitride.

Concerning the response speed, it is possible for electrons among the photocarriers generated at the p-type non-depleting light absorbing layer to overcome a hetero-barrier between the p-type field buffer layer 14 and the p-type depleted light absorbing layer 15 at a very high response speed of more than the order of GHz. The reason for the above is that the electrons, due to their small effective mass and large thermal diffusion speed, are injected into the p-type depleted light absorbing layer 15 within a time period short enough to provide a Gbps response by electron diffusion transit, if the thickness of the light absorbing layer is less than 2 $\mu$m, and subsequently the electrons acquire energy by being accelerated by the electric field in the p-type depleted light absorbing layer. In the above process, in order to acquire energy from the electric field of the p-type depleted light absorbing layer, it is necessary for electrons to have a considerable transit distance. That is, the range of the transition distance is determined as follows. The lowest value of the p-type depleted light absorbing layer 15 is the minimum value for electrons to be able to acquire energy by the electric field acceleration; and the upper limit is the highest value which results in giving the effect of the high reliability.

In contrast, the positive holes among photo carriers generated in the p-type non-depleted light absorbing layer 16 respond in a short period within the dielectric buffer time, and are collected at the p-type electrode 111. Furthermore, when a particular structure that the carrier concentration of the p-type non-depleted light absorbing layer 16 is altered in stepwise or continuously toward the depleted light absorbing layer, is added to the present avalanche photodiode, since the inclination of the Fermi level accelerates electron diffusion, a higher speed response relative to the thickness of the p-type non-depleted light absorbing layer can be obtained (even when the thickness is as thick as 1.5 to 2 $\mu$m, a high speed response close to 10 Gbps is obtained).

According to the element structure as described hereinabove, a mesa-type APD is provided having a simple structure and high reliability. FIG. 1 illustrates an avalanche photo diode having a back-illumination structure to which a structure of the present invention is adapted.

FIG. 2 illustrates an avalanche photodiode which is provided with a waveguide structure, a back-illumination structure, and a passivation film 210, which is easy to form, formed by use of inorganic materials such as silicon nitride. The features of this APD are ease of manufacturing, a high response speed on the order of Gbps and a high reliability, and also ease of passive mounting with other waveguides at reduced cost.

The second avalanche photodiode of the present invention is formed by a laminated structure on the substrate in the order comprising a first conductivity type semiconductor buffer layer, a first conductivity type semiconductor light absorbing layer, a first conductivity type semiconductor field buffer layer, a semiconductor multiplication layer, an etching stop layer, a second conductivity type semiconductor cap layer, and a second conductivity type semiconductor contact layer; and furthermore a first conductivity type transforming semiconductor region formed at a peripheral area of a light receiving region with a thickness which reaches the first conductivity type semiconductor field buffer layer and an annular isolation trench region formed between the second conductivity type semiconductor cap layer and the first conductivity type transforming semiconductor region on the light receiving region; wherein the first conductivity type semiconductor light absorbing layer is composed of two layers, one of which is a depleted layer region disposed adjacent to the first conductivity type field buffer layer with a thickness of 10 nm to 0.3 µm, and another one of which is a non-depleted layer region disposed adjacent to the depleted layer region at a thickness of less than 2 µm. In the above avalanche photodiode, the first conductivity type corresponds to, for example, the p-type and the second conductivity type corresponds to the n-type.

The second avalanche photodiode of the present invention has an edge illumination structure formed by etching, and it is preferable that the length from the edge surface to the first conductivity type transforming region is less than 20 µm.

It is also preferable that the length from the back surface of the edge surface light incidence structure to the first conductivity type transforming region is less than 20 µm.

Furthermore, it is preferable that the carrier concentration of the first conductivity type light absorbing layer alters toward the depleted light absorbing layer stepwise or continuously.

The functional feature of the second avalanche photodiode of the present invention is described hereinafter with reference to FIGS. 3 and 4.

Although the planar type elemental structure shown in FIG. 3 is based on the conventional example shown in FIG. 8 (disclosed in "IEEE, Photonics Technology Letters", vol. 8, pp.827–829, 1996), it is a novel feature that the depleted region disposed adjacent to the p-type semiconductor light absorbing layer 35 (corresponding to 83 in FIG. 8) is composed of two layers, one of which is a depleted region 34 having a thickness in a range of 10 nm to 0.3 µm, disposed adjacent to the p-type semiconductor field buffer layer and the other one of which is a non-depleted region 33 having a thickness of less than 2 µm disposed adjacent to the depleted region 34.

In contrast, in the conventional example, the p-type semiconductor light absorbing layer 83 is constituted of a light absorbing layer which includes a depleted layer having an individual thickness of more than 1 µm.

In the present invention, since the layer thickness of the light absorbing layer to be depleted is extremely thin, and since the bias voltage distributed to that thin light absorbing layer is extremely low (less than a few volts), the present invention has an advantageous feature that the homogeneous multiplication in the surface can easily be obtained without mounting a guard ring which is normally necessary in an APD having a separate light absorption and multiplication (SAM) structure. That is, the lower limit of the thickness of the depleted light absorbing layer 34 is given as the minimum value for acquiring energy for overcoming the hetero barrier by the field acceleration, and the upper limit is the maximum value for obtaining homogeneous multiplication with high repeatability without using a guard ring.

As hereinabove described, the present invention provides a planar-type APD having a simple structure, a high speed response on the order of Gbps, and a high reliability. As shown in FIG. 3, application of the structure of the present invention to the back-illumination structure facilitates provides a lower capacitance to the APD than the front illumination structure.

FIG. 4 illustrates a structure of the APD of the present invention, which has a waveguide structure and an edge-illumination structure formed by etching and which also has a novel feature in that the length between the light incident edge surface portion to the depleted p-type transformed region 411 is less than 20 µm. The depleted p-type transformed region in such a structure includes some inactive area which absorbs light but does not conduct multiplication. However, the thickness of such a layer is so thin in the present invention that light absorption is not prominent and reduction of the quantum efficiency is unlikely to occur. Furthermore, high quantum efficiency can be provided even if the length of the element is short (low element capacitance), since it is possible to use a reflected light even if the element is subjected to light absorption by coating a high reflective film.

In such an element structure, the light confining function of the waveguide in the traverse direction is obtained by forming the n-type cap layer 48 at the upper part of the light receiving region into a ridge shape. In this struture, the same response speed is obtained as that of the present invention shown in FIG. 1.

The planar-type APD with the waveguide structure has advantageous features in ease of manufacture, in high speed response on the order of Gbps, high reliability, and another advantage is low mounting cost due to the capability of passive mounting with other optical waveguides.

DETAILED DESCRIPTION OF THE PREFERRED EMBODIMENTS

Figure 1:
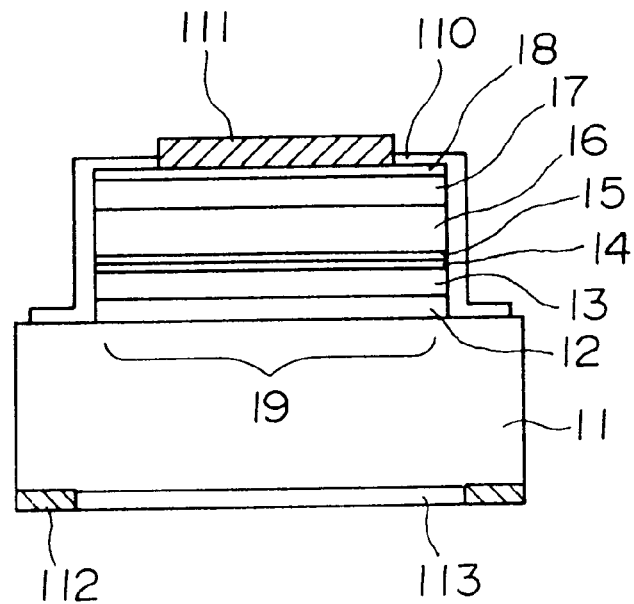
FIG. 1 is a cross-sectional view showing a first avalanche photodiode of the present invention.
Figure 2:
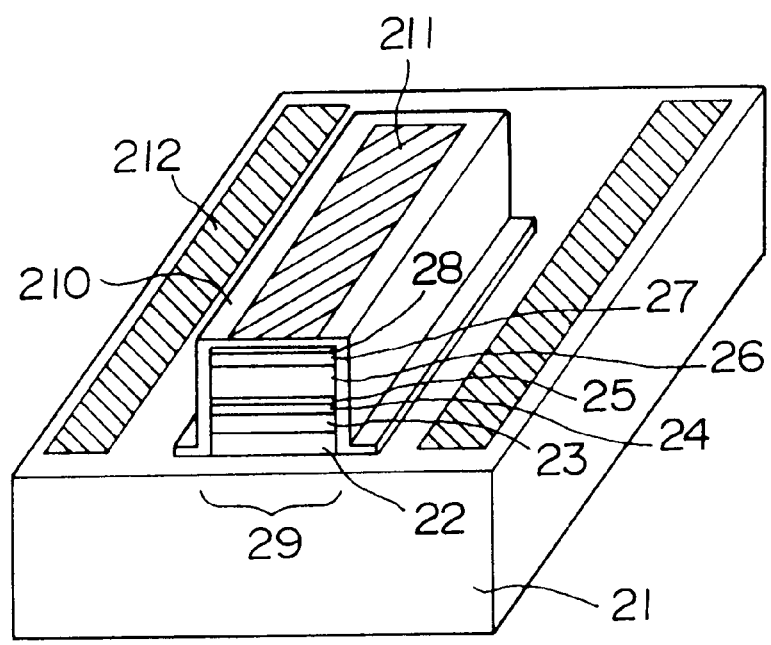
FIG. 2 is a cross-sectional view showing an edge-illumination structure of the first avalanche photodiode of the present invention.
Figure 3:
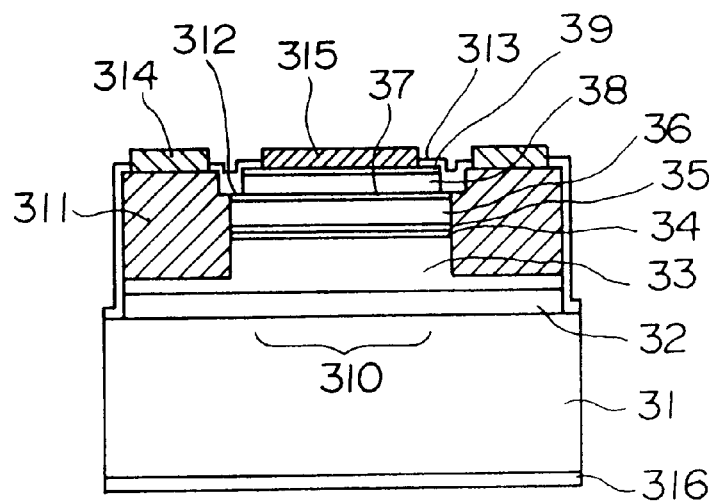
FIG. 3 is a cross-sectional view showing a second avalanche photodiode of the present invention.
Figure 4:
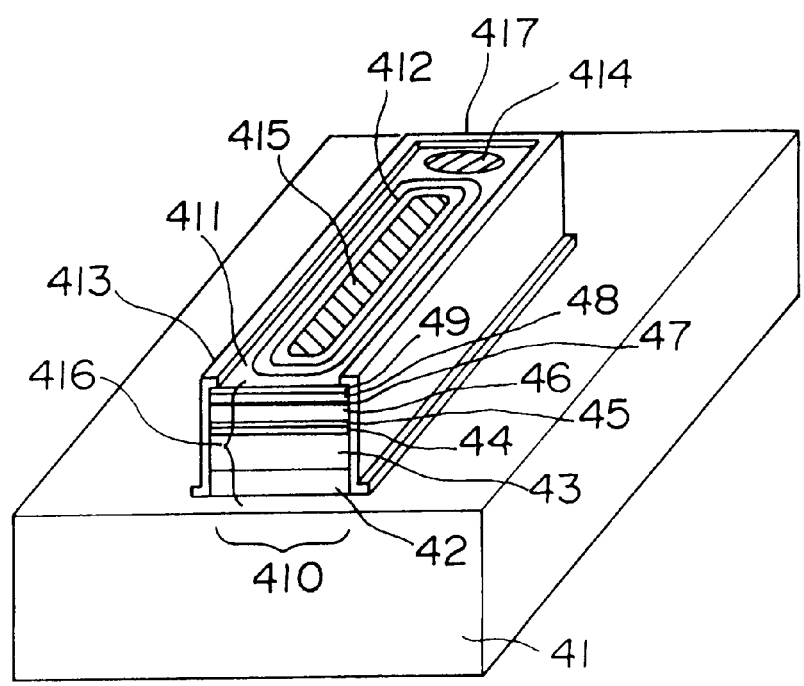
FIG. 4 is a cross-sectional view showing an edge-illumination structure of the second avalanche photodiode of the present invention.
Figure 5:
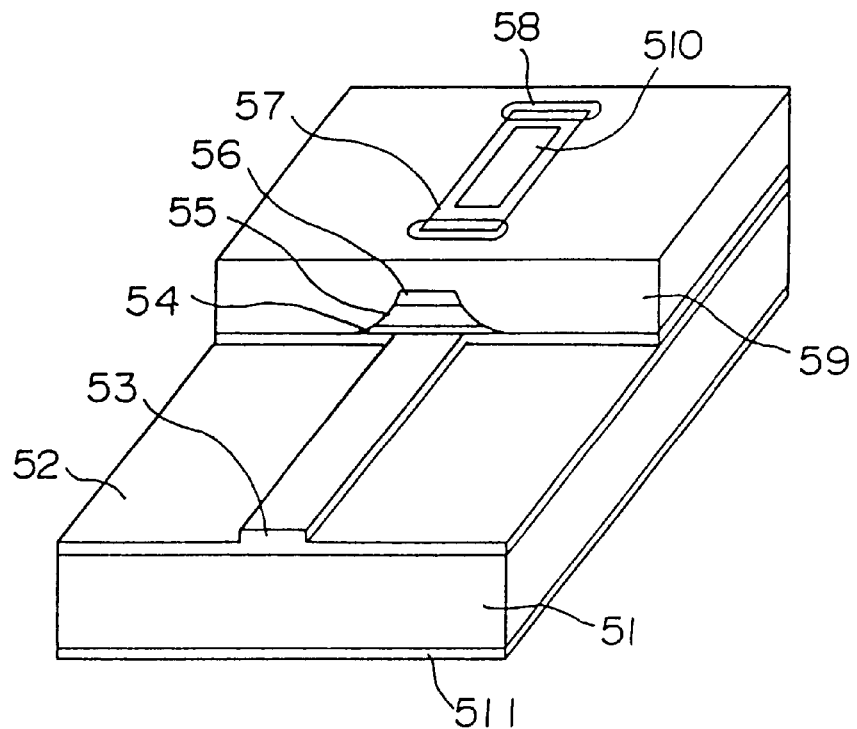
FIG. 5 is a cross-sectional view showing a first example of conventional avalanche photodiodes.
Figure 6:
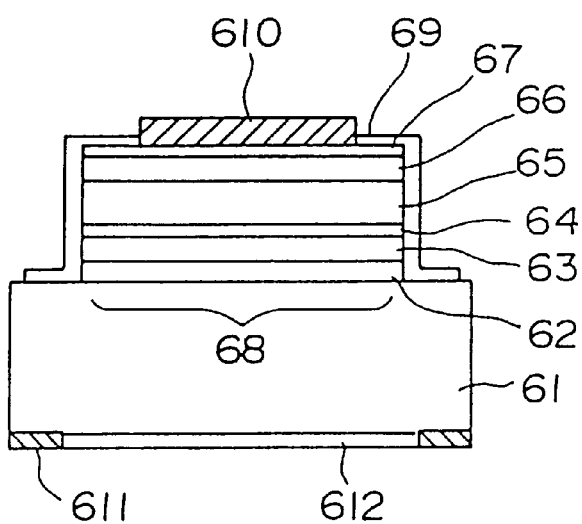
FIG. 6 is a cross-sectional view showing a second example of conventional avalanche photodiodes.
Figure 7:
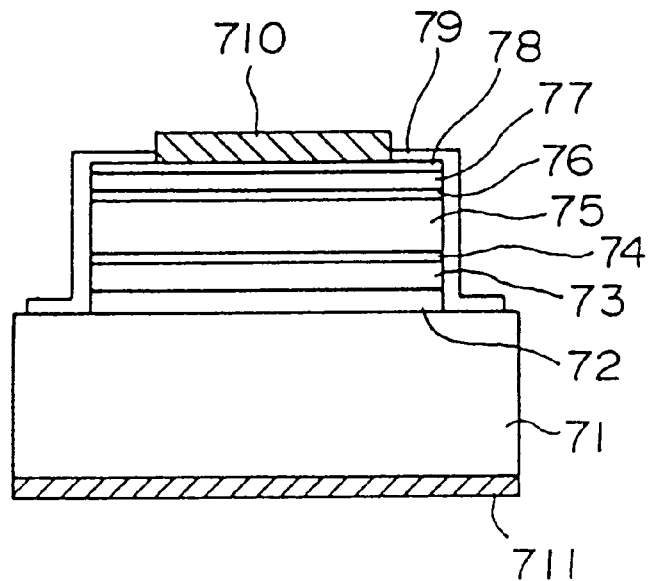
FIG. 7 is a cross-sectional view showing a third example of conventional avalanche photodiodes.
Figure 8:
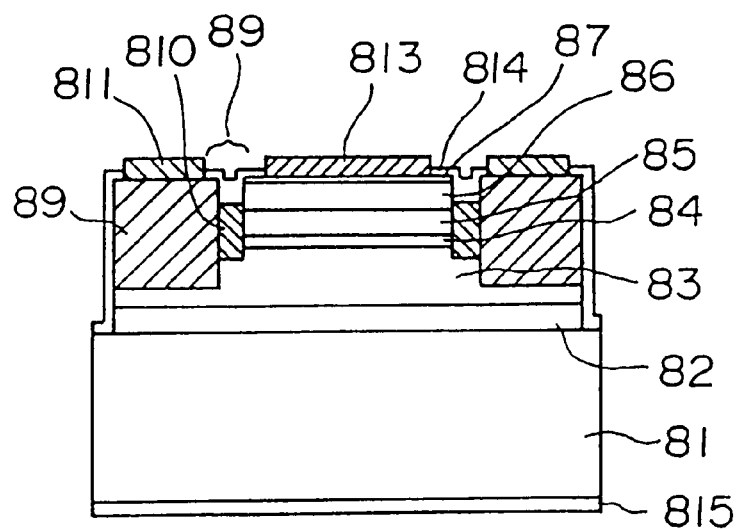
FIG. 8 is a cross-sectional view showing a fourth example of conventional avalanche photodiodes.
Figure 9:
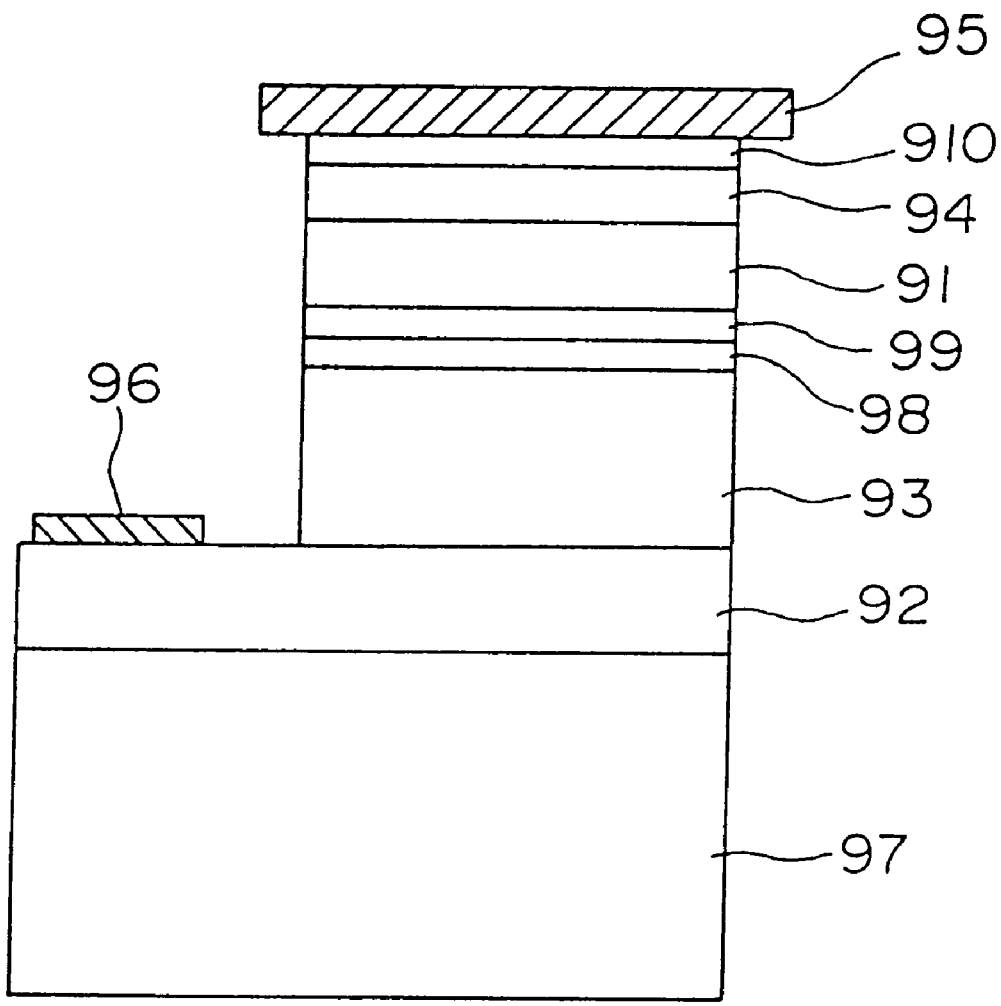
FIG. 9 is a cross-sectional view showing a fifth example of conventional photodiodes.

Hereinfter, the first embodiment of the present invention will be described.

On an n-type substrate 11, the following layers are deposited by a gas-source MBE (Molecular Beam Epitaxy) method in due order, which include, an n-type buffer layer 12 of a thickness of about 1 µm; a non-doped InAlGaAs/InAlAs superlattice multiplication layer 13 of a thickness of less than 0.5 µm; a $p^+$-type InP field buffer layer 14 of a thickness of 30 to 100 nm; a p-type depleted InGasAs light absorbing layer 15 of a thickness of 10 nm; a p-type non-depleted InGaAs light absorbing layer 16 of a thickness less than 2.0 µm; a $p^+$-type InP cap layer 17 of a thickness of 0.5 µm; a $p^+$-type InGaAs layer 18 at a thickness of 0.1 µm.

Subsequently, a circular light receiving mesa-region 19 with a diameter in the range of 20 to 50 µm is formed by etching. A passivation film 110 is formed by SiN or by polyimide, p/n electrodes 111/112 are formed, and, after the substrate 11 is mirror polished to approximately 150 µm, the AR coat 113 is formed on the rear surface of the substrate.

The first mesa-type avalanche photodiode which receives light at the rear surface is made by the above processes.

The first avalanche photodiode of the present invention is proved to have a high speed response characteristic (the GB (gain-bandwidth) product is 70 to 80 GHz) at a low dark current such as a multiplication dark current of less than 10 nA, and the first avalanche photodiode of the present invention is recognized to have sufficient reliability because the dark current does not change after aging for 1000 hours at 150° C.

Hereinafter, the second embodiment of the present invention will be described.

First, the following layers are deposited on an n-type substrate 21 by the gas-source MBE method in due order, which include an n-type buffer layer 22 of a thickness of approximately 1 μm, a non-dope InAlGaAs/InAlAs superlattice multiplication layer 23 of a thickness of less than 2.0 μm, a p$^+$-type InP field buffer layer 24 of a thickness in a rage of 30 to 100 nm, a p-type depleted InGaAs light absorbing layer 25 of a thickness of 10 nm, a p-type non-depleted InGaAs light absorbing layer 26 of a thickness less than 2.0 μm, a p$^+$-type InP cap layer 27 of a thickness of 0.5 nm, and a p$^+$-InGaAs layer 28 at a thickness of 0.1 μm.

Subsequently, a rectangular light receiving mesa region 29 in the width of 10 nm and the length of 50 to 100 μm is formed by etching. The passivation film 210 is formed using SiN, the p/n electrodes 211/212 are then formed, and the substrate is mirror polished into approximately 150 μm.

In addition, a polyimide layer is applied for relieving and reinforcing the step excepting the light receiving area in the rectangular mesa region.

The mesa-type waveguide structured avalanche photodiode according the second embodiment of the present invention is made as described above.

The second avalanche photodiode is recognized to have a high speed response (the GB product is 70 to 80 GHz) at a low dark current such as a low multiplication dark current of 10 nA and the second element of the present invention is recognized to have sufficient reliability because the dark current does not change after aging for 1000 hours at 150° C.

Hereinafter, the third embodiment of the present invention will be described.

First, the following layers are deposited on a SI-InP substrate 31 by the gas-source MBE method in due order, which include a p-type buffer layer 32 of a thickness of approximately 1 μm, a p-type non-depleted InGaAs light absorbing layer 33 of a thickness of less than 2.0 μm, a p-type depleted InGaAs light absorbing layer 34 at a thickness of 10 nm, a p$^+$-type InP field buffer layer 35 of a thickness in a range of 30 to 100 nm, a non-dope InAlGaAs/InAlAs superlattice multiplication layer 36 of a thickness of less than 0.5 μm, a non-doped InP etching stop layer 37 of a thickness of 10 nm, a n$^+$-type InAlAs cap layer 38 of a thickness of 0.5 μm, and a n$^+$-type InGaAs layer 39 of a thickness of 0.1 μm. Either the p-type or n-type InP substrate may be used.

Subsequently, an annular shaped isolation trench 312 with a width of 2 to 20 μm is formed by a selective etching method using the etching stop layer 37 at an outside area of the circular light receiving region 310 having a diameter of 25 μm. Subsequently, a p-type region 311 is formed selectively at an outside area of the annular shaped separation groove 312 by diffusion of Zn or by an Be ion implantation, leaving the circular region 310 inside the annular region. In the case of Be ion implantation, a two inches full wafer may be subjected to processing. The passivation film 313 is formed by use of silicon nitride or polyimide, the p/n electrodes 314/315 are formed, and the AR coat 316 is formed on the rear side of the substrate after the substrate 31 is mirror polished to approximately 150 μm.

The third element, which is the back-illumination structure planar-type avalanche photodiode according to the third embodiment of the present invention is formed by the above processes.

The third avalanche photodiode is recognized to have a high speed response (the GB product is 70 to 80 GHz) at a low dark current such as a low multiplication dark current of 10 nA, and the third element of the present invention is recognized to have sufficient reliability because the dark current does not change after aging for 1000 hours at 150° C.

Hereinafter, the fourth embodiment of the present invention will be described.

First, the following layers are deposited on a SI-InP substrate 41 by the gas-source MBE method in due order, which include a p-type buffer layer 42 of a thickness of approximately 1 μm, a p-type non-depleted InGaAs light absorbing layer 43 of a thickness of less than 2.0 μm, a p-type depleted InGaAs light absorbing layer 44 of a thickness of 10 nm, a p$^+$-type InP field buffer layer 45 of a thickness in the range of 30 to 100 nm, a non-doped InAlGaAs/InAlAs superlattice multiplication layer 46 of a thickness of less than 0.5 μm, a non-dope InP etching stop layer 47 of a thickness of 10 nm, a n$^+$-type InAlAs cap layer 48 of a thickness of 0.5 μm, and a n$^+$-type InGaAs layer 49 of a thickness of 0.1 μm. The p-type or n-type InP substrate may be used similarly.

At the outside periphery of a light receiving region 410 which is formed in the form of an elongated rectangular waveguide structure so as to connect two circular portions with a diameter of 15 μm disposed on both ends of the mesa region, an annular shaped isolation trench 412 having a width of 2 to 10 μm is formed around the rectangular waveguide structure by selective etching using the above etching stop layer 47. Subsequently, at the outside periphery of the annular separation groove 412, a p-type region 411 is formed by diffusion of Zn or by ion implantation of Be. In the case of ion implantation of Be ions, a two inch full wafer may be processed. Subsequently, a rectangular waveguide mesa is formed by a mesa-etching process, and a passivation film 413 is deposited using silicone nitride, and after forming p/n electrodes 414/415, the substrate 41 is mirror polished to approximately 150 μm. The passivation film acts as a nonreflective film (AR) 416 at the light incident edge.

The planar waveguide-type avalanche photodiode according to the fourth embodiment of the present invention is made by the above manufacturing processes.

The fourth avalanche photodiode is recognized to have a high speed response (the GB product is 70 to 80 GHz) at a dark current such as a low multiplication dark current of 10 nA and the fourth diode of the present invention is recognized to have sufficient reliability because the dark current does not change after aging for 1000 hours at 150° C. It is also recognized that the present photodiode is easily used as an element for passive alignment mounting with other light waveguide devices (PLC etc.)

An element in which a high reflective film is formed on the back edge surface of the waveguide structure is recognized to be capable of providing a short waveguide length, that is, a low element capacitance and a high quantum efficiency.

It is to be understood that modifications may by included within the scope of the present invention. That is, use of an etching stop layer is shown in the third and fourth embodiments, but a similar elemental structure may be formed by dry etching without degrading the depthwise accuracy, so that dry etching is included in the scope of the present invention.

Furthermore, in the waveguide structured avalanche photodiodes according to the second and fourth embodiments, it is possible to improve the external quantum efficiency by transforming the waveguide mode to a multi-mode by inserting a non-depleted intermediate refractive index layer in the waveguide structure of the APD, in order to reduce the coupling loss between a light incidence surface of the APD and an optical fiber.

In each of the above described embodiments from the first to the fourth embodiments, the description is given for the case that the InAlAs/InAlGaAs super lattice layer is used as the multiplication layer, and the InP is used as the field buffer layer. However, it is possible to adopt modified elemental structures in which an InAlAs/InGaAsP superlattice layer, an InAlAs/InGaAs super lattice layer, or a semiconductor layer including Al (such as InAlAs, InAlAsP) as the multiplication layer, and an InAlAs layer or an InGaAsP layer as the field buffer layer are used in combinations.

In the above described embodiments from the first to the fourth embodiment, the carrier concentration of the non-depleted light absorbing layer is assumed to be homogeneous. However, it is possible to adopt modified element structures in which the carrier concentration changes stepwise or continuously toward the depleted light absorbing layer.

In the above described third and fourth embodiments, it is possible to adopt p-type InP or n-type InP for the substrate.

As described above in detail, the avalanche photodiode of the present invention provides a high sensitivity light receiving element for use in next generation subscriber's optical communication system, and the light receiving element of the present invention is simple in structure, and reliable and has a Giga-bit response characteristic.

What is claimed is:

1. An avalanche photodiode having a laminated structure on a semiconductor substrate comprising:

a first conductivity type buffer layer;

a semiconductor multiplication layer;

a second conductivity type semiconductor field buffer layer;

a second conductivity type depleted semiconductor light absorbing layer adjacent to the second conductivity type semiconductor field buffer layer and having a thickness of 10 nm to 0.3 $\mu$m;

a second conductivity type non-depleted semiconductor light absorbing layer adjacent to the second conductivity type depleted semiconductor light absorbing layer and having a thickness of less than 2 $\mu$m;

a second conductivity type semiconductor cap layer; and a second conductivity type semiconductor contact layer.

2. An avalanche photodiode according to claim 1, wherein said first conductivity type corresponds to the n-type conductivity and said second conductivity type corresponds to the p-type conductivity.

3. An avalanche photodiode according to claim 1, wherein said avalanche photodiode possesses an edge-illumination structure formed by etching.

4. An avalanche photodiode according to claim 1, wherein a carrier concentration in said second conductivity type light absorbing layer alters toward said depleted light absorbing layer in stepwise or continuously.

5. An avalanche photodiode having a laminated structure formed on a semiconductor substrate comprising:

a first conductivity type buffer layer;

a first conductivity type non-depleted semiconductor light absorbing layer adjacent to the first conductivity type buffer layer and having a thickness of less than 2 $\mu$m;

a first conductivity type depleted semiconductor light absorbing layer adjacent to the first conductivity type non-depleted semiconductor light absorbing layer and having a thickness of 10 nm to 0.3 $\mu$m;

a first conductivity type semiconductor field buffer layer;

a semiconductor multiplication layer;

an etching stop layer;

a second conductivity type semiconductor cap layer;

a second conductivity type semiconductor contact layer; and furthermore a first conductivity type transformed region having a thickness at least reaching said first conductivity type semiconductor field buffer layer formed at a peripheral area of a light receiving region; and an annular shaped separation groove region having a depth corresponding to the sum of said second conductivity type semiconductor contact layer and said cap layer formed between said second conductivity type semiconductor cap layer and said first conductivity type transformed region on said light receiving region.

6. An avalanche photodiode according to claim 5, wherein said first conductivity type corresponds to p-type conductivity and said second conductivity type correspond to n-type conductivity.

7. An avalanche photodiode according to claim 5, wherein said avalanche photodiode possesses an edge-illumination structure at the edge surface formed by etching and the length of said first conductivity type region from said light incident structure at the edge surface is less than 20 $\mu$m.

8. An avalanche photodiode according to claim 5, wherein the length of said first conductivity region from a back edge surface of said edge surface light incident structure is less than 20 $\mu$m.

9. An avalanche photodiode according to claim 5, wherein the carrier concentration of said first conductivity type light absorbing layer alters stepwise or continuously toward said depleted light absorbing layer.

* * * * *